United States Patent
Park et al.

(10) Patent No.: US 8,431,984 B2
(45) Date of Patent: Apr. 30, 2013

(54) NONVOLATILE MEMORY DEVICES INCLUDING DEEP AND HIGH DENSITY TRAPPING LAYERS

(75) Inventors: Kwangmin Park, Seoul (KR); Juwan Lim, Hwaseong-si (KR); Seungjae Baik, Hwaseong-si (KR); Siyoung Choi, Seongnam-si (KR); Kihyun Hwang, Seongnam-si (KR); Juyul Lee, Seoul (KR)

(73) Assignee: Samsung Electronics Co., Ltd. (KR)

( * ) Notice: Subject to any disclaimer, the term of this patent is extended or adjusted under 35 U.S.C. 154(b) by 187 days.

(21) Appl. No.: 13/035,477

(22) Filed: Feb. 25, 2011

(65) Prior Publication Data
US 2011/0147825 A1    Jun. 23, 2011

Related U.S. Application Data

(63) Continuation-in-part of application No. 12/612,453, filed on Nov. 4, 2009.

(30) Foreign Application Priority Data

Nov. 18, 2008 (KR) .......... 10-2008-0114593

(51) Int. Cl.
*H01L 29/792* (2006.01)

(52) U.S. Cl.
USPC .................. 257/324; 257/E29.309

(58) Field of Classification Search .......... 257/324, 257/411, E29.309
See application file for complete search history.

(56) References Cited

U.S. PATENT DOCUMENTS

| | | | |
|---|---|---|---|
| 6,906,390 B2 | 6/2005 | Nomoto et al. | |
| 7,012,299 B2 | 3/2006 | Mahajani et al. | |
| 7,259,433 B2 | 8/2007 | Nomoto et al. | |
| 7,602,067 B2 | 10/2009 | Ma et al. | |
| 8,258,571 B2* | 9/2012 | Endoh et al. | 257/324 |
| 2003/0122204 A1 | 7/2003 | Nomoto et al. | |
| 2005/0230766 A1 | 10/2005 | Nomoto et al. | |
| 2008/0023750 A1 | 1/2008 | Xue et al. | |
| 2008/0042192 A1 | 2/2008 | Park et al. | |
| 2008/0067577 A1 | 3/2008 | Wang et al. | |
| 2010/0123181 A1* | 5/2010 | Park et al. | 257/324 |

FOREIGN PATENT DOCUMENTS

| | | |
|---|---|---|
| JP | 2002-9181 A | 1/2002 |
| JP | 2002-203917 A | 7/2002 |
| KR | 10-0825787 B | 4/2008 |
| KR | 10-0827201 B1 | 5/2008 |
| KR | 10-2009-0068012 A | 6/2009 |

OTHER PUBLICATIONS

Wu et al., "SONOS Device With Tapered Bandgap Nitride Layer," IEEE Transactions on Electron Devices, vol. 52, No. 5, pp. 987-992, May 2005.*

* cited by examiner

*Primary Examiner* — Mark Prenty
(74) *Attorney, Agent, or Firm* — Myers Bigel Sibley & Sajovec, P.A.

(57) ABSTRACT

A charge trap nonvolatile memory device includes a gate electrode on a substrate; a charge trapping layer between the gate electrode and the substrate, the charge trapping layer having trap sites configured to trap charges; a charge tunneling layer between the trapping layer and the semiconductor substrate; and a charge blocking layer between the gate electrode and the trapping layer. The charge trapping layer comprises a deep trapping layer having a plurality of energy barriers and a high density trapping layer having a trap site density higher than a trap site density of the deep trapping layer.

19 Claims, 16 Drawing Sheets

100 110 120 130 150

US 8,431,984 B2

NONVOLATILE MEMORY DEVICES INCLUDING DEEP AND HIGH DENSITY TRAPPING LAYERS

CROSS-REFERENCE TO RELATED APPLICATIONS

This application is a continuation-in-part of U.S. patent application Ser. No. 12/612,453, filed on Nov. 4, 2009, which claims the priority of Korean Patent Application No. 10-2008-0114593, filed on Nov. 18, 2008 in the Korean Intellectual Property Office. The disclosures of all the above applications are incorporated herein by reference.

BACKGROUND OF THE INVENTIVE CONCEPT

Various embodiments disclosed herein relate to nonvolatile memory devices, and more particularly, to a charge trap type of nonvolatile memory devices.

Generally, nonvolatile memory devices can electrically erase and program data and can retain their stored data even when their power supplies are interrupted. Thus, nonvolatile memory devices are used in various fields.

Nonvolatile memory devices may be classified into floating gate type of nonvolatile memory devices and a charge trap type of nonvolatile memory devices according to a kind of a memory storage layer constituting a unit cell. A charge trap type of nonvolatile memory devices can realize low power, low voltage and/or high integration.

A charge trap type of a nonvolatile memory device includes a charge trapping layer for injecting and storing charges, a charge tunneling layer and a charge blocking layer. Storing charges in the trapping layer can be performed using a difference of an energy band gap on each layer.

Also, a charge trap type of a nonvolatile memory device can be classified into a single level cell (SLC) storing one bit in one cell and a multi level cell (MLC) storing a plurality of bits in one cell.

SUMMARY

Nonvolatile memory devices according to various embodiments described herein may include a gate electrode on a substrate; a charge trapping layer between the gate electrode and the substrate, the charge trapping layer having trap sites configured to trap charges; a charge tunneling layer between the charge trapping layer and the substrate; and a charge blocking layer between the gate electrode and the charge trapping layer. The charge trapping layer comprises a deep trapping layer having a plurality of energy barriers and a high density trapping layer having a trap site density higher than a trap site density of the deep trapping layer.

Various other embodiments described herein also provide nonvolatile memory devices that may include a gate electrode on a substrate; a charge trapping layer between the gate electrode and the substrate, the charge trapping layer comprising first trapping layers including silicon and nitrogen and second trapping layers including silicon, nitrogen and oxygen that are alternately stacked, wherein the first and second trapping layers have different composition stoichiometries therebetween; a charge tunneling layer between the charge trapping layer and the substrate; and a charge blocking layer between the gate electrode and the charge trapping layer. Nitrogen content in one first trapping layer is greater than nitrogen content in another first trapping layer.

Yet other embodiments provide nonvolatile memory devices that include a substrate, a gate electrode that is spaced apart from the substrate, and a charge tunneling layer, a charge blocking layer, a high density charge trapping layer and a deep charge trapping layer, all of which are stacked between the substrate and the gate electrode. The high density charge trapping layer and the deep charge trapping layer have different composition stoichiometry therebetween that are also different than that of both the charge tunneling layer and the charge blocking layer. As used herein, the term "composition stoichiometry" means the atomic makeup of a molecule. Thus, for example, two layers of silicon oxynitride that have different relative amounts of silicon, oxygen and nitrogen therebetween have different composition stoichiometries and two different compounds, such as silicon nitride and silicon dioxide also have different composition stoichiometries.

BRIEF DESCRIPTION OF THE DRAWINGS

The accompanying figures are included to provide a further understanding of embodiments of the inventive concept, and are incorporated in and constitute a part of this specification. The drawings illustrate various embodiments of the inventive concept and, together with the description, serve to explain principles of embodiments of the inventive concept. In the figures.

DETAILED DESCRIPTION OF THE EMBODIMENTS

Figure 1:
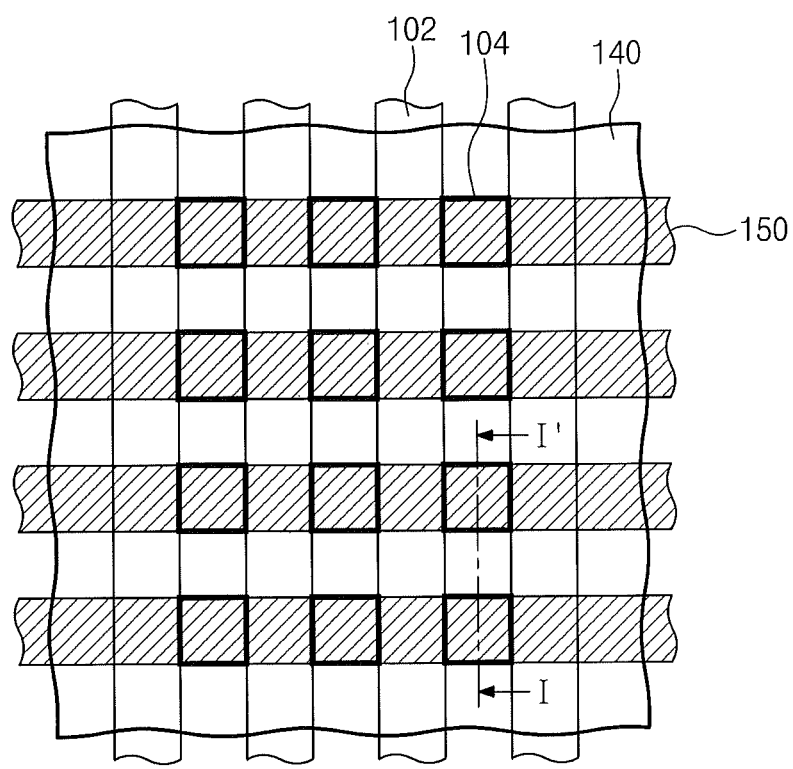
FIG. 1 is a top plan view of a nonvolatile memory device in accordance with embodiments of the inventive concept.

Various embodiments of the inventive concept now will be described more fully hereinafter with reference to the accompanying drawings, in which embodiments of the invention are shown. This invention may, however, be embodied in many different forms and should not be construed as limited to the embodiments set forth herein. Rather, these embodiments are provided so that this disclosure will be thorough and complete, and will fully convey the scope of the invention to those skilled in the art. In the drawings, the size and relative sizes of layers and regions may be exaggerated for clarity. Like numbers refer to like elements throughout.

It will be understood that when an element is referred to as being "connected" or "coupled" to another element, it can be directly connected or coupled to the other element or intervening elements may be present. In contrast, when an element is referred to as being "directly connected" or "directly coupled" to another element, there are no intervening elements present. As used herein, the term "and/or" includes any and all combinations of one or more of the associated listed items and may be abbreviated as "/".

It will be understood that, although the terms first, second, etc. may be used herein to describe various elements, these elements should not be limited by these terms. These terms are only used to distinguish one element from another. For example, a first region/layer could be termed a second region/layer, and, similarly, a second region/layer could be termed a first region/layer without departing from the teachings of the disclosure.

The terminology used herein is for the purpose of describing particular embodiments only and is not intended to be limiting of the invention. As used herein, the singular forms "a", "an" and "the" are intended to include the plural forms as well, unless the context clearly indicates otherwise. It will be further understood that the terms "comprises" and/or "comprising," or "includes" and/or "including" when used in this specification, specify the presence of stated features, regions, integers, steps, operations, elements, and/or components, but do not preclude the presence or addition of one or more other features, regions, integers, steps, operations, elements, components, and/or groups thereof. In contrast, the term "consisting of" when used in this specification, specifies the stated features, steps, operations, elements, and/or components, and precludes additional features, steps, operations, elements and/or components.

Embodiments of the inventive concept may be described with reference to top plan and cross-sectional illustrations, which are schematic illustrations of idealized embodiments of the inventive concept. As such, variations from the shapes of the illustrations, as a result, for example, of manufacturing techniques and/or tolerances, are to be expected. Thus, embodiments of the inventive concept should not be construed as limited to the particular shapes of regions illustrated herein, but are to include deviations in shapes that result from, e.g., manufacturing. For example, a region illustrated as a rectangle may have rounded or curved features. Thus, the regions illustrated in the figures are schematic in nature and are not intended to limit the scope of the inventive concept.

Unless otherwise defined, all terms (including technical and scientific terms) used herein have the same meaning as commonly understood by one of ordinary skill in the art to which this invention belongs. It will be further understood that terms, such as those defined in commonly used dictionaries, should be interpreted as having a meaning that is consistent with their meaning in the context of the relevant art and/or the present application, and will not be interpreted in an idealized or overly formal sense unless expressly so defined herein.

In the drawings, the thickness of layers and regions are exaggerated for clarity. It will also be understood that when an element such as a layer, region or substrate is referred to as being "on" or "onto" another element, it may lie directly on the other element or intervening elements or layers may also be present. In contrast, when an element is referred to as being "directly on" or extending "directly onto" another element, there are no intervening elements present. Like reference numerals refer to like elements throughout the specification.

Spatially relatively terms, such as "beneath," "below," "above," "upper," "top," "bottom" and the like, may be used to describe an element and/or feature's relationship to another element(s) and/or feature(s) as, for example, illustrated in the figures. It will be understood that the spatially relative terms are intended to encompass different orientations of the device in use and/or operation in addition to the orientation depicted in the figures. For example, when the device in the figures is turned over, elements described as below and/or beneath other elements or features would then be oriented (rotated 90 degrees or at other orientations) and the spatially relative descriptors used herein interpreted accordingly. As used herein, "height" refers to a direction that is generally orthogonal to the faces of a substrate.

Figure 2:
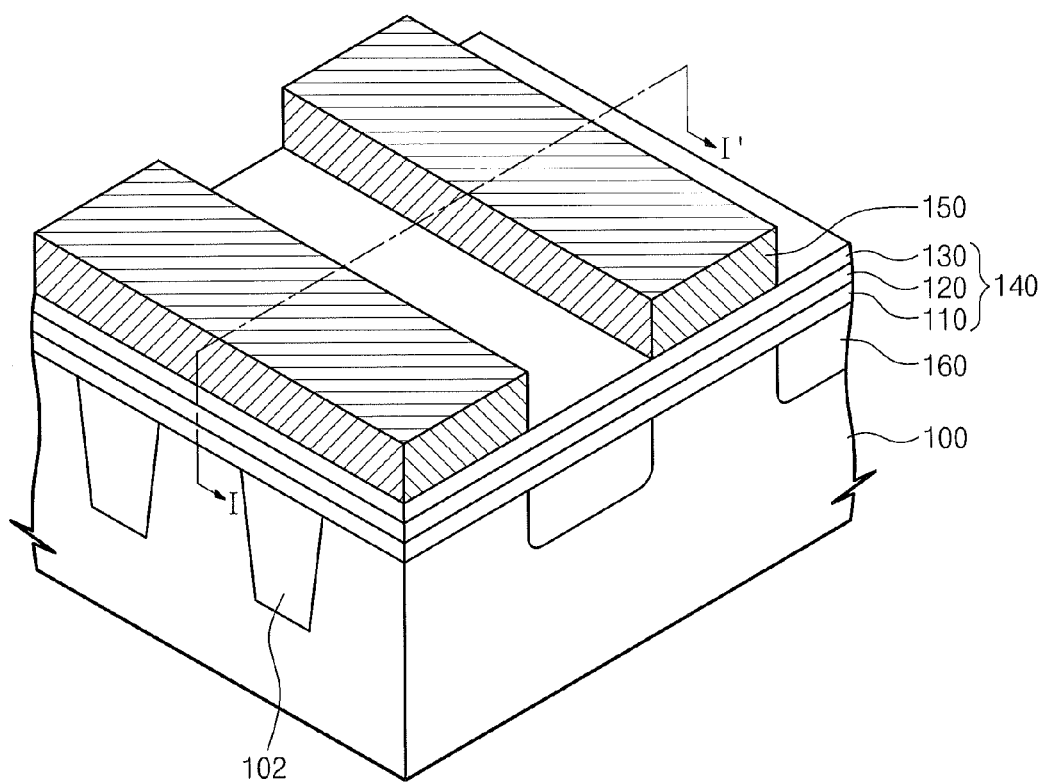
FIG. 2 is a perspective view of a nonvolatile memory device in accordance with embodiments of the inventive concept.
Figure 3:
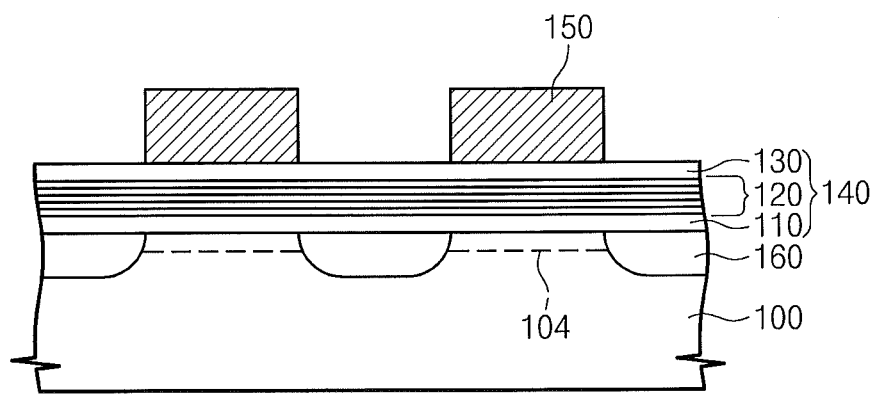
FIG. 3 is a cross-sectional view of a nonvolatile memory device in accordance with embodiments of the inventive concept taken along the line I-I" of FIGS. 1 and 2.
Figure 4:
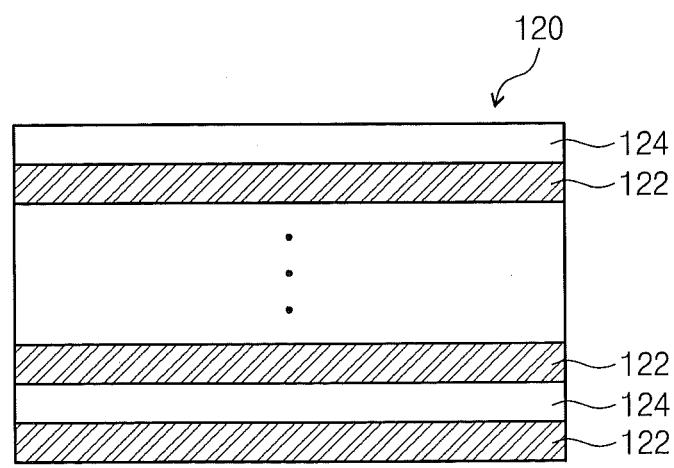
FIG. 4 is a drawing illustrating a charge trapping layer included in a nonvolatile memory device in accordance with embodiments of the inventive concept.

FIG. 1 is a top plan view of a nonvolatile memory device in accordance with embodiments of the inventive concept. FIG. 2 is a perspective view of a nonvolatile memory device in accordance with embodiments of the inventive concept. FIG. 3 is a cross-sectional view of a nonvolatile memory device in accordance with embodiments of the inventive concept taken along the line I-I" of FIGS. 1 and 2. FIG. 4 is a drawing illustrating a charge trapping layer included in a nonvolatile memory device in accordance with embodiments of the inventive concept.

Referring to FIGS. 1 through 3, a substrate 100 including active regions defined by a device isolation layer 102 is provided. The active regions include a channel region 104 and source/drain regions 160.

The substrate 100 may be a bulk silicon substrate, a SOI (silicon-on-insulator) substrate, a germanium substrate, a GOI (germanium on insulator) substrate, a silicon-germanium substrate or a substrate of an epitaxial thin film obtained by performing a SEC (selective epitaxial growth) and/or any other microelectronic substrate.

The device isolation layer 102 may be an insulating layer buried in a trench formed in the substrate 100 and may have a plane structure of a line shape. Since the device isolation layers 102 are spaced a predetermined distance apart from each other, the active regions of a line pattern can be defined.

A trap structure 140 is formed on the substrate 100 in which the active regions are defined. The trap structure 140 may include a charge tunneling layer 110, a charge trapping layer 120 and a charge blocking layer 130 that are sequentially stacked on the substrate 100. The trap structure 140 may extend in upper portions of the active regions and the device isolation layers and may be locally formed on an upper portion of each active region.

The charge tunneling layer 110 is a layer through which charges can tunnel when a high electric field is applied between a gate electrode 150 and the substrate 100. For example, the charge tunneling layer 110 may comprise a silicon oxide layer (SiO2) and/or a silicon oxynitride layer (SiON). The charge tunneling layer 110 may also comprise a high dielectric material such as $Al_2O_3$, $HfO_2$, $ZrO_2$, $La_2O_3$, $Ta_2O_3$, $TiO_2$, $SrTiO_3$(STO), (Ba,Sr)$TiO_3$(BST) or a multilayer stacked with combinations thereof.

The charge tunneling layer 110 may be formed by means of a thermal oxidation, a CVD (chemical vapor deposition) process and/or an ALD (atomic layer deposition) process and may have a thickness of about 10 Å to 100 Å.

The charge trapping layer 120 includes a plurality of first and second charge trapping layers (122, 124 of FIG. 4) and charges tunneled from the substrate 100 are trapped in the charge trapping layer 120. The charge trapping layer 120 has, as depicted in FIG. 4, a laminate structure on which the first and second charge trapping layers 122 and 124 are alternately and repeatedly stacked. That is, the first and second charge trapping layers 122 and 124 of at least two layers are provided between the charge tunneling layer 110 and the charge blocking layer 130.

Also, the first and second charge trapping layers 122 and 124 may be sequentially and repeatedly stacked on the charge tunneling layer 110. In some embodiments of the inventive concept, the first and second charge trapping layers 122 and 124 may have the same number (e.g., n number) of layers respectively. Thus, a top surface of the charge tunneling layer 110 is in contact with the first charge trapping layer 122 and a bottom surface of the charge blocking layer 130 may be in contact with the second charge trapping layer 124. Alternatively, both the charge tunneling layer 110 and the charge blocking layer 130 may be in contact with the first charge trapping layer 122 or the second charge trapping layer 124. In other embodiments, the first and second charge trapping layers 122 and 124 may have different numbers of layers from each other.

Here, the first charge trapping layers 122 are formed of material having a first energy band gap and the second charge trapping layers 124 are formed of material having a second energy band gap that is different from, and in some embodiments greater than, the first energy band gap. In some embodiments of the inventive concept, the first charge trapping layers 122 of at least two layers formed between the charge tunneling layer 110 and the charge blocking layer 130 have the same energy level of a conduction band and the same energy level of a valence band. Similarly, the second charge trapping layers 124 of at least two layers also have the same energy level in a conduction band or a valence band. In other embodiments, all the first charge trapping layers 122 have the same band gap and all the second charge trapping layers 124 have the same band gap. In other words, at least two of the first charge trapping layers 122 may have the same energy band gap and at least the two of second charge trapping layers 124 may have the same energy band gap. The first and second charge trapping layers 122 and 124 have an energy band gap smaller than an energy band gap of the charge tunneling layer 110. In other embodiments, at least two of the first and/or second charge trapping layers 122 and 124 have different energy band gaps therebetween.

Alternatively, in other embodiments of the inventive concept, an energy level of a conduction band or a valence band between the first charge trapping layers 122 may become different by controlling nitrogen content. In this case, an energy barrier exists between the first charge trapping layer 122 and the second charge trapping layer 124. For example, the first charge trapping layer 122 may be a silicon nitride layer having an energy band gap of about 4.5 to 5.5 eV and the second charge trapping layer 124 may be a silicon oxynitride layer having an energy band gap of about 5.0 to 7.3 eV. Here, since the second charge trapping layer 124 comprised of a silicon oxynitride layer includes an oxygen atom, the oxygen atom may disturb a movement of trapped charges. Thus, mobility of charges in a silicon oxynitride layer is reduced compared with a silicon nitride layer. That is, in the charge trapping layer 120 extending in adjacent memory cells, at least some charges trapped in the charge trapping layer 120 may be prevented from being laterally diffused into upper portions of the device isolation layer 102 and the source/drain regions 160.

Thus, when retaining charges by trapping charges in the charge trapping layer 120, at least some of the charges can be prevented from horizontally moving and then disappearing. Therefore, a characteristic of charge retention and reliability of a nonvolatile memory device can be improved.

The charge trapping layer 120 may be formed by means of a CVD (chemical vapor deposition) process and/or an ALD (atomic layer deposition) process and may have a thickness of about 10 to 200 Å. More specifically, when the charge trapping layer 120 is formed by means of an ALD (atomic layer deposition), the first and second charge trapping layers 122 and 124 may be formed by controlling a supply time of an oxidizing agent. In some embodiments of the inventive concept, the first and second charge trapping layers 122 and 124 may be deposited to have about the same thickness. In other embodiments of the inventive concept, the first and second charge trapping layers 122 and 124 may be deposited to have a different thickness from each other.

When the charge tunneling layer 110 is formed of a silicon oxynitride layer, an energy band gap of the second trapping layer 124 may become smaller than an energy band gap of the charge tunneling layer 110 by forming an oxygen content of the second charge trapping layer 124 to be smaller than an oxygen content of the charge tunneling layer 110.

Since the first and second charge trapping layers 122 and 124 of a laminate structure are formed between the charge tunneling layer 110 and the charge blocking layer 130, first and second energy band gaps can periodically appear. An energy barrier may be formed at an interface between the first and second charge trapping layers 122 and 124 by a difference of the first and second energy band gaps.

The charge blocking layer 130 insulates the charge trapping layer 120 and the gate electrode 150 and prevents at least some charges from flowing in the charge trapping layer 120 from the gate electrode 150 or in the gate electrode 150 from the charge trapping layer 120. Thus, the charge blocking layer 130 is formed of material having an energy band gap greater than the charge trapping layer 120. The blocking layer 130 may also be formed of material having a dielectric constant higher than the charge tunneling layer 110. That is, the charge blocking layer 130 may have an energy band gap greater than energy band gaps of the charge tunneling layer 110 and the charge trapping layer 120. For example, the charge blocking layer 130 may be formed of a high dielectric material such as $Al_2O_3$, $HfO_2$, $ZrO_2$, $La_2O_3$, $Ta_2O_3$, $TiO_2$, $SrTiO_3$(STO), (Ba,Sr)$TiO_3$(BST) or a multilayer stacked with combinations thereof. Accordingly, in some embodiments, the first and second charge trapping layers 122 and 124 have different composition stoichiometries therebetween that are also different than that of both the charge tunneling layer 110 and the charge blocking layer 130.

The gate electrode 150 is formed on the charge blocking layer 130 and may be a line pattern which crosses the active regions. A plurality of gate electrodes 150 are spaced apart from each other on the charge blocking layer 130. The gate electrode 130 may be formed of a single layer comprised of doped polysilicon, metal material such as W, Pt, Ir, conductive metal nitride such as TiN, TaN, WN or conductive metal oxide such as RuO$_2$, IrO$_2$ or a multi layer comprised of combinations thereof.

The source/drain regions 160 are formed in the active region of both sides of the gate electrode 150 and a channel region is formed between the source/drain regions 160 by applying a predetermined voltage to the gate electrode 150.

Figure 5:
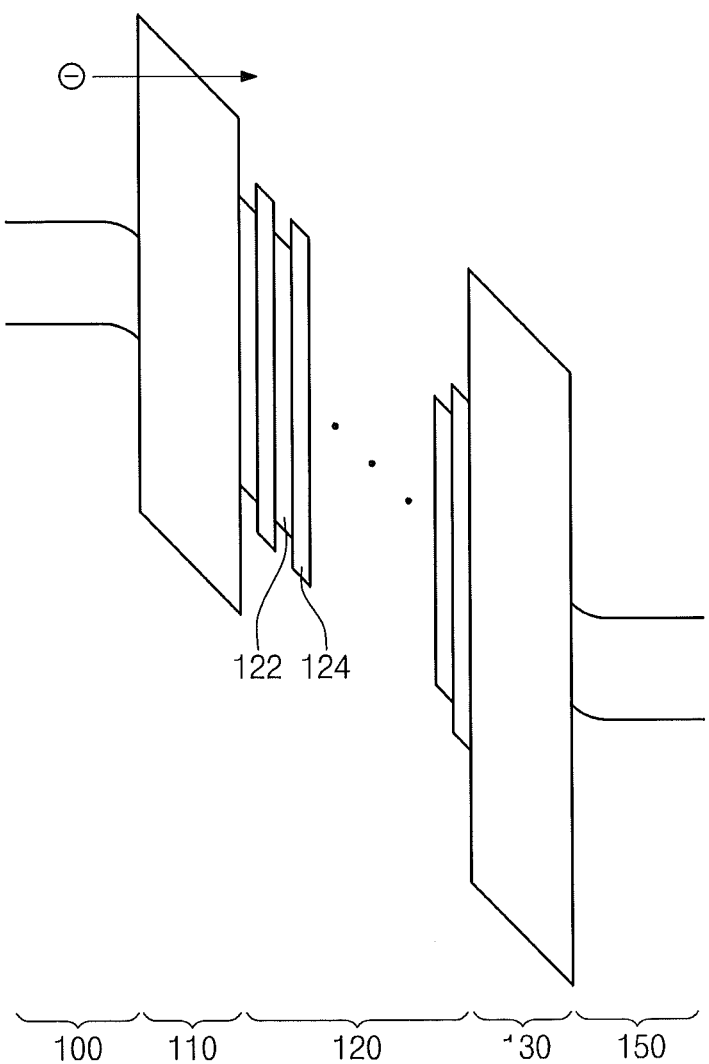
FIG. 5 is an energy band diagram during a program operation in a nonvolatile memory device in accordance with embodiments of the inventive concept.

FIG. 5 is an energy band diagram during a program operation in a nonvolatile memory device in accordance with embodiments of the inventive concept.

Referring to FIG. 5, as a voltage for a program operation is applied to the gate electrode, energy bands of the charge tunneling layer 110, the charge trapping layer 120 and the charge blocking layer 130 may be bent due to a difference of electric potential between the gate electrode 150 and the substrate 100. Charges in the substrate 100 are trapped in the charge trapping layer 120 by F-N (Fowler-Nordheim) tunneling.

Charges tunneled in the charge trapping layer 120 may be trapped in the first and second trapping layers 122 and 124 according to energies that the charges have. Since energy band gaps of the first and second charge trapping layers 122 and 124 are different from each other, the probability that the charges tunneled in the charge trapping layer 120 move to the gate electrode 150 is gradually decreased as the charges pass through irregular energy bands. That is, since mobility of charges in the charge trapping layer 120 is decreased, the probability that charges are trapped in the charge trapping layer 120 may be increased.

Figure 6:
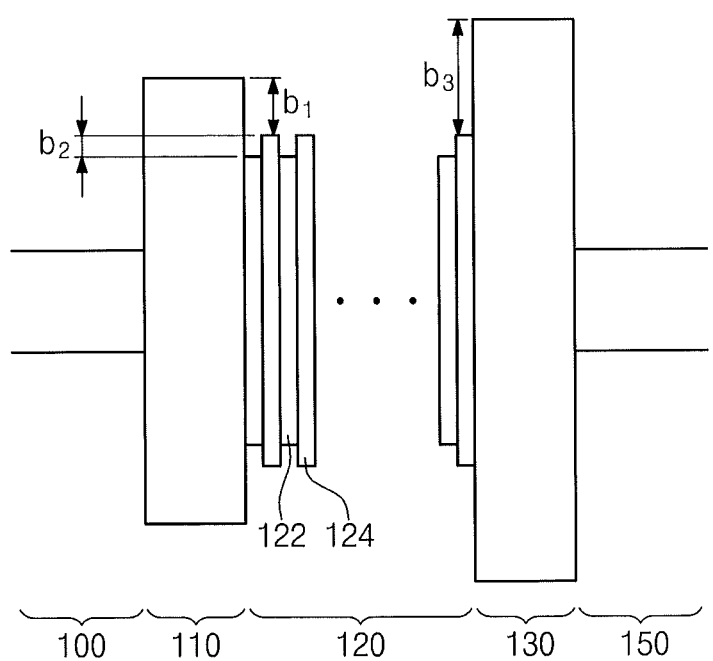
FIG. 6 is an energy band diagram of a charge maintaining state in a nonvolatile memory device in accordance with embodiments of the inventive concept.

FIG. 6 is an energy band diagram of a charge maintaining state in a nonvolatile memory device in accordance with embodiments of the inventive concept. Although energy bands of a charge trapping layer are horizontally depicted in FIG. 6, the energy bands of the charge trapping layer may be bent by charges trapped in the charge trapping layer.

Referring to FIGS. 3 and 6, the charge tunneling layer 110, the charge trapping layer 120, the charge blocking layer 130 and the gate electrode 150 may have different energy band gaps from each other and may form an energy barrier according to a difference of energy band gaps.

A first energy barrier (b1) or a second energy barrier (b1+b2) is formed between the charge tunneling layer 110 and the charge trapping layer 120. Here, the first energy barrier (b1) is a difference of an energy band gap between the charge tunneling layer 110 and the second charge trapping layer 124 and the second energy barrier (b1+b2) is a difference of an energy band gap between the charge tunneling layer 110 and the first charge trapping layer 122.

Since the first and second charge trapping layers 122 and 124 having different band gaps from each other are alternately disposed on the charge tunneling layer 110, a plurality of energy barriers may be formed between the charge tunneling layer 110 and the charge blocking layer 130. That is, a third energy barrier (b2), which is a difference of the first and second energy band gaps, may be formed between the first charge trapping layer 122 and the second charge trapping layer 124. At this time, the third energy barrier (b2) may be smaller than the first energy barrier (b1). Since the first and second charge trapping layers 122 and 124 are alternately disposed, the first and second energy band gaps may periodically appear. That is, the third energy barrier (b2) may be periodically formed between the charge tunneling layer 110 and the charge blocking layer 130. Here, a period that the third energy barriers (b2) are formed may be different depending on thicknesses of the first and second charge trapping layers 122 and 124.

As the third energy barriers (b2) are periodically formed between the charge tunneling layer 110 and the charge blocking layer 130, charges in the charge trapping layer 120 have to go over a plurality of the third energy barriers (b2) so as to move in a direction (i.e., a vertical direction) of the charge blocking layer 130 from the charge tunneling layer 110. Thus, even though charges move in a vertical direction, the probability that the charges tunneled in the charge trapping layer 120 go over the third barriers (b2) is gradually decreased.

Since the third energy barriers (b2) are periodically formed in the charge trapping layer 120, at least some charges may be prevented from moving in a direction of the charge blocking layer 130 from the charge tunneling layer 110. Thus, when retaining charges by trapping charges in the charge trapping layer 120, at least some of the charges can be prevented from vertically moving and then disappearing. As described above, since mobility of charges in the second charge trapping layers 120 is decreased, a horizontal movement of at least some trapped charges may be prevented. Thus, a characteristic of charge retention and reliability of a nonvolatile memory device can be improved.

A fourth energy barrier (b3) is formed between the charge trapping layer 120 and the blocking layer 130. The fourth energy barrier (b3) may be greater than the first energy barrier (b1) between the charge tunneling layer 110 and the charge trapping layer 120. The fourth energy barrier (b3) can prevent at least some charges from tunneling back from the gate electrode 150 to the charge trapping layer 120.

Figure 7A:
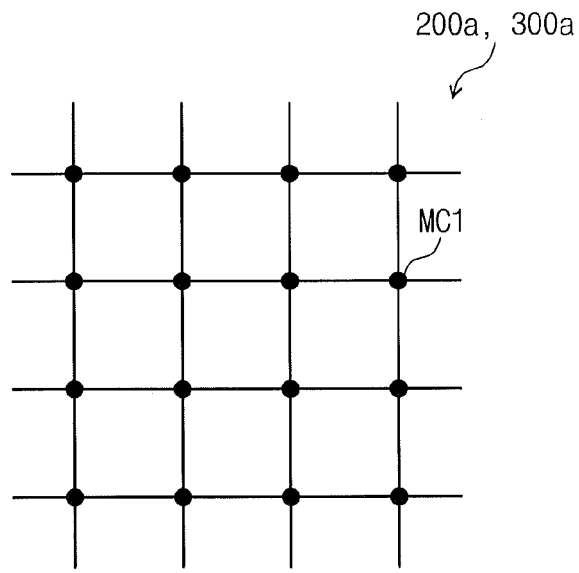
FIGS. 7A and 7B are drawings illustrating whether nonvolatile memory devices for testing a characteristic of HTS (high temperature stability) store charges or not.
Figure 7B:
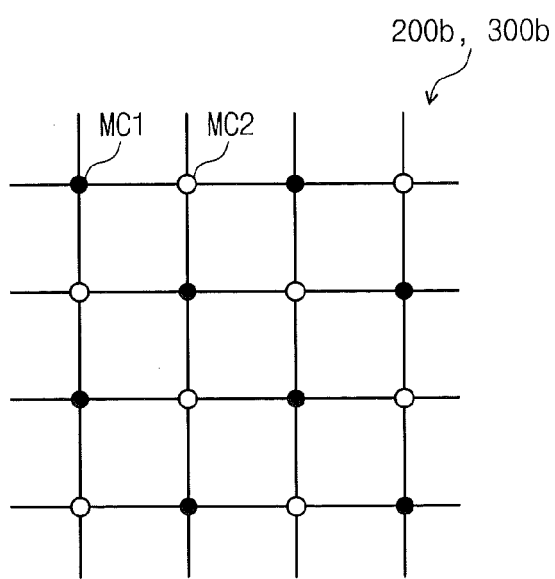
Figure 8:
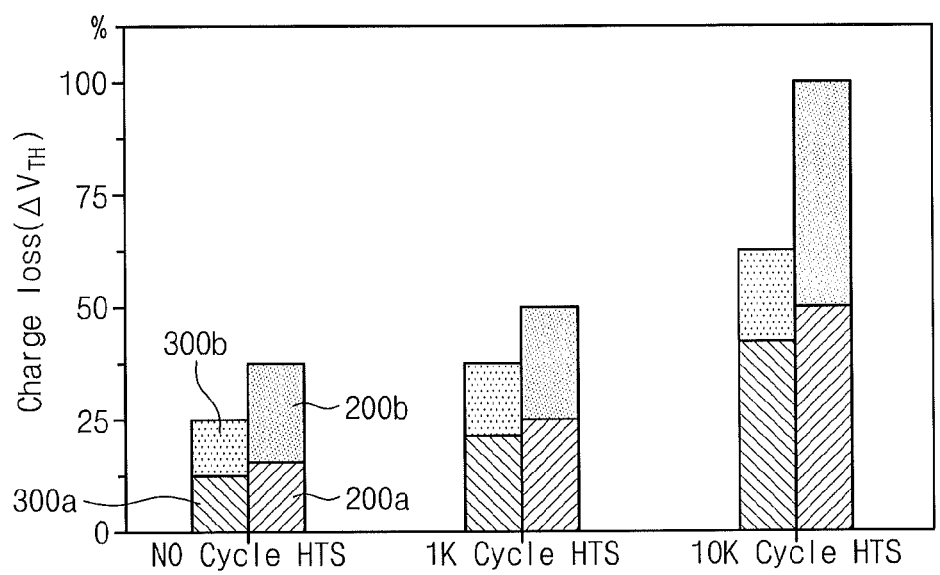
FIG. 8 is a graph illustrating a nonvolatile memory device in accordance with an embodiment of the inventive concept and a characteristic of HTS of a nonvolatile memory device in accordance with a conventional technique.

FIGS. 7A and 7B are drawings illustrating whether nonvolatile memory devices for testing a characteristic of HTS store charges or not. FIG. 8 is a graph illustrating characteristics of HTS of a nonvolatile memory device in accordance with embodiments of the inventive concept and a nonvolatile memory device in accordance with a conventional technique.

In FIGS. 7A, 7B and 8, drawing symbols '200a and 200b' represent a nonvolatile memory device according to a conventional technique and drawing symbols '300a and 300b' represent a nonvolatile memory device according to embodiments of the inventive concept.

In a nonvolatile memory device according to a conventional technique, a charge tunneling layer is formed of a silicon oxide layer (SiO2), a charge trapping layer is formed of a silicon nitride layer, a charge blocking layer is formed of alumina (Al2O3—) and a gate electrode is formed of a tantalum nitride layer (TaN).

In a nonvolatile memory device according to embodiments of the inventive concept, a charge tunneling layer is formed of a silicon oxide layer (SiO2), a charge trapping layer is formed of a silicon nitride layer (SiN) and a silicon oxynitride layer (SiON) that are repeatedly stacked, a charge blocking layer is formed of alumina (Al2O3—) and a gate electrode is formed of a tantalum nitride layer (TaN).

As depicted in FIGS. 7A and 7B, nonvolatile memory devices having memory cells of which charge storage states are different from each other are prepared for a nonvolatile memory device according to a conventional technique and for a nonvolatile memory device according to embodiments of the inventive concept respectively. In FIGS. 7A and 7B, 'MC1' represents a memory cell in which a charge is stored and 'MC2' represents a memory cell in which a charge is not stored (i.e., erased).

FIG. 7A represents a nonvolatile memory device 200a and 300a having memory cells disposed to have a matrix shape in an entire portion of which charges are stored. FIG. 7B represents a nonvolatile memory device 200b and 300b having memory cells disposed to have a matrix shape in a portion of which charges are stored. In the nonvolatile memory device 200b and 300b of FIG. 7B, charges are not stored in the memory cell (MC2) disposed at one side of the memory cell (MC1) in which charges are stored.

When repeatedly performing a program operation and an erase operation as much as 0 cycle, 1000 cycles and 10000 cycles on nonvolatile memory devices 200a, 200b, 300a and 300b according to a conventional technique and embodiments of the inventive concept respectively and then baking them for two hours at a temperature of 200° C., a charge loss is calculated from a change (ΔVth) of a threshold voltage being measured. The result is shown in FIG. 8.

When comparing HTS of FIGS. 7A and 7B, a diffusion of a horizontal direction is substantially the same but since a side diffusion of FIG. 7B that charges are not stored in memory cells disposed at one side is great, a difference (ΔVth) of a charge loss in the memory cells of FIGS. 7A and 7B may be a difference of a side diffusion. Thus, a memory device having a small difference of a charge loss may have high reliability.

If comparing the nonvolatile memory devices 200a and 300a having memory cells in an entire portion of which charges are stored, it can be appreciated that a charge loss of the nonvolatile memory device 300a according to embodiments of the inventive concept is smaller than a charge loss of the nonvolatile memory device 200a of a conventional technique. Also, in a case of a nonvolatile memory device 200b and 300b having memory cells in a portion of which charges are stored, it can be appreciated that a charge loss of the nonvolatile memory device 300b of embodiments of the inventive concept is greatly reduced compared with a charge loss of the nonvolatile memory device 200b of a conventional technique. That is, in the nonvolatile memory device, it can be appreciated that a side diffusion of charges trapped in a charge trapping layer is greatly reduced. Thus, reliability of a nonvolatile memory device according to embodiments of the inventive concept can be greatly improved compared with the nonvolatile memory device of a conventional technique.

Figure 9:
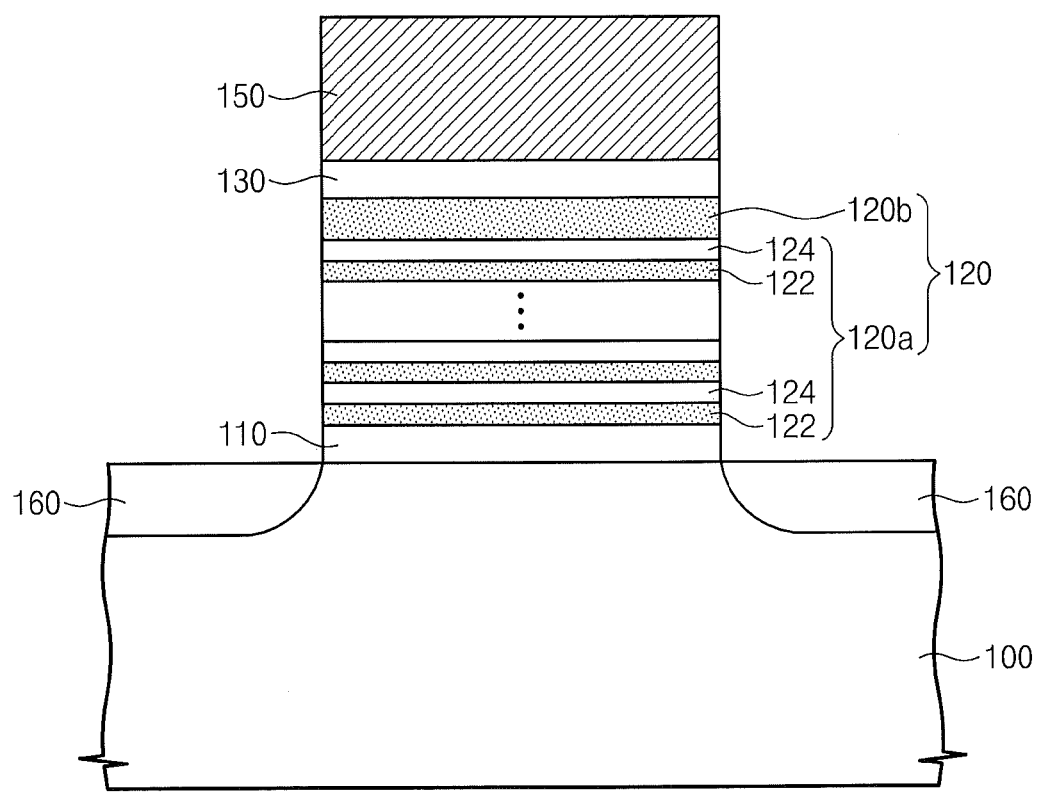
FIG. 9 is a cross-sectional view of a charge trapping layer included in a nonvolatile memory device in accordance with other embodiments of the inventive concept.
Figure 10:
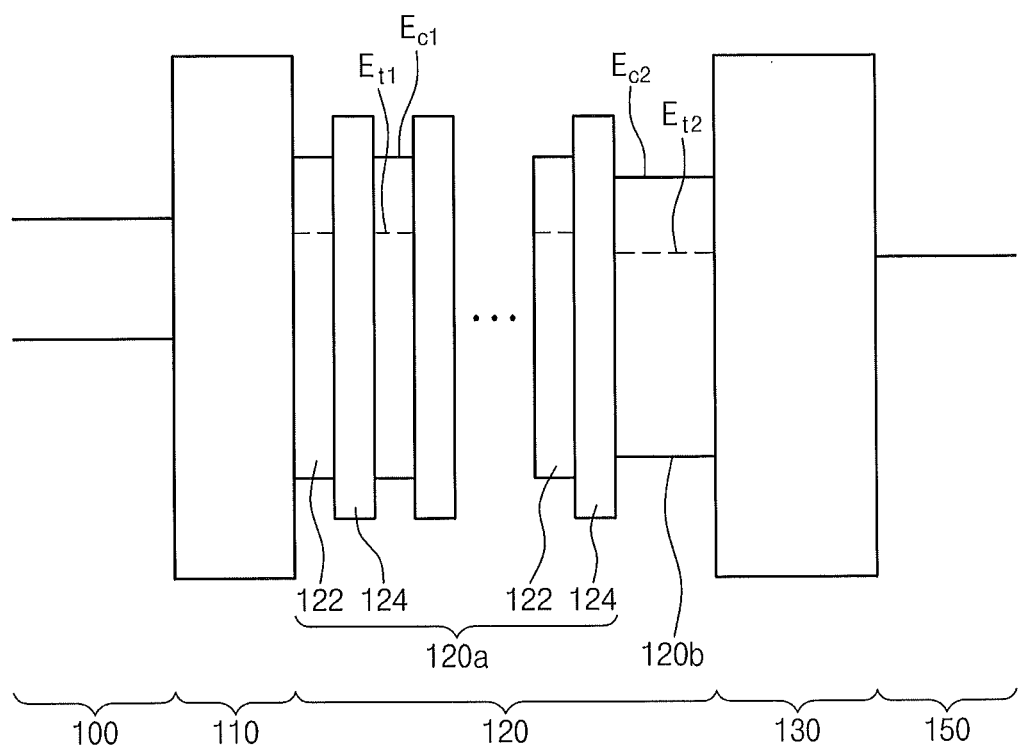
FIG. 10 is an energy band diagram of a nonvolatile memory device in accordance with other embodiments of the inventive concept.

FIG. 9 is a cross-sectional view of a charge trapping layer included in a nonvolatile memory device in accordance with other embodiments of the inventive concept. FIG. 10 is an energy band diagram of a nonvolatile memory device in accordance with other embodiments of the inventive concept.

Referring to FIGS. 9 and 10, a gate electrode 150 is disposed between source/drain regions 160 spaced apart from each other in a substrate, such as a semiconductor substrate 100. A charge tunneling layer 110 is interposed between the gate electrode 150 and the semiconductor substrate 100 and a charge blocking layer 130 is interposed between the gate electrode 150 and the charge tunneling layer 110. A charge trapping layer 120 is interposed between the charge tunneling layer 110 and the charge blocking layer 130. The semiconductor substrate 100, the charge tunneling layer 110, the charge trapping layer 120, the charge blocking layer 130 and the gate electrode 150 have its own energy band gap respectively. If a plurality of gate electrodes 150 is adjacently disposed enough for channel regions of the memory cells to be electrically connected to one another by a voltage applied to the gate electrode, the source/drain regions 160 disposed on both sides of the gate electrode 150 may be omitted.

The nonvolatile memory device illustrated in FIG. 9 may be similar to other embodiments described above, but the charge trapping layer 120 may include a deep trapping layer 120a and a high density trapping layer 120b.

More specifically, the charge trapping layer 120 has trap sites in which charges are trapped. The charge trapping layer 120 has an energy level (i.e., a trap energy level) such that the trap sites are located between a conduction band and a valence band. Here, the trap energy level of the charge trapping layer 120 may become different according to a trap density of the trap sites which exist in the charge trapping layer 120. If a density of the trap sites increases, a trap energy level may become high. That is, if a density of the trap site in the charge trapping layer 120 increases, charges may be trapped in a shallow energy level from the conduction band.

According to the present embodiments, a density of the trap sites in the high density trapping layer 120b spaced apart from the charge tunneling layer 110 and adjacent to the charge blocking layer 130 is higher than a density of the trap sites in the deep trapping layer 120a. Since a density of the trap sites in the high density trapping layer 120b is higher than a density of the trap sites in the deep trapping layer 120a, as illustrated in FIG. 10, a trap energy level $E_{t1}$ of the deep trapping layer 120a may be lower than a trap energy level $E_{t2}$ of the high density trapping layer 120a. That is, a trap depth of charges from the conduction bands $E_{t1}$ of the deep trapping layer 120a may be greater than a trap depth of charges from the conduction bands $E_{t2}$ of the high density trapping layer 120b.

The deep trapping layer 120a, as illustrated in embodiments of FIG. 9, has a laminate structure that the first and second charge trapping layers 122 and 124 are alternately and repeatedly stacked. The deep trapping layer 120a may include at least two first and second charge trapping layers 122 and 124 and a thickness of the deep trapping layer 120a is about 20 Å~100 Å. Here, an energy gap of the first charge trapping layer 122 may be smaller than an energy gap of the second charge trapping layer 124. The first charge trapping layer 122 may directly contact the charge tunneling layer 110. Energy band gaps of the first and second charge trapping layers 122 and 124 are smaller than energy band gaps of the charge tunneling layer 110 and the charge blocking layer 130.

Since the energy band gaps of the first and second charge trapping layers 122 and 124 are different from each other, the deep trapping layer 120a may have energy barriers which are an energy difference of conduction bands between the first charge trapping layer 122 and the second charge trapping layer 124. Since the first and second charge trapping layers 122 and 124 are alternately stacked in the deep trapping layer 120a, the deep trapping layer 120a may have a plurality of energy barriers and the energy barriers may be periodically formed. In nonvolatile memory devices in accordance with some embodiments, the charge trapping layer 120 between the charge tunneling layer 110 and the charge blocking layer 130 may have an energy band that energy levels of the conduction band are non-linear and energy levels of the valence band are non-linear.

The first charge trapping layer 122 may be formed of (e.g., may consist of) silicon and nitrogen and the second charge trapping layer 124 may be formed of (e.g., may consist of) silicon, nitrogen and oxygen. In other embodiments, the first trapping layers include silicon and nitrogen, and the second trapping layers include silicon, nitrogen and oxygen, wherein the first and second trapping layers have different composition stoichiometries therebetween. For example, the first charge trapping layer 122 may be a silicon nitride layer having an energy band gap of about 4.5~5.5 eV and the second charge trapping layer 124 may be a silicon oxynitride layer having an energy band gap of about 5.0~7.3 eV. An oxygen atom in the second charge trapping layer 124 may disturb a lateral movement of charges trapped in the second charge trapping layer 124. Thus, a lateral diffusion that charges trapped in the charge trapping layer 124 move to adjacent cells may be reduced or prevented.

An energy band gap of the first charge trapping layer 122 formed of a silicon nitride layer may become different according to a concentration of nitrogen atoms. As a concentration of nitrogen atoms increases, an energy band gap of the first charge trapping layer 122 may be increased and therefore, a trap energy level is increased. Also, as a concentration of oxygen atoms in the second charge trapping layer 124 increases, an energy band gap of the second charge trapping layer 124 may increase. Since the energy band gap of the second charge trapping layer 124 have to be smaller than the energy band gaps of the charge tunneling layer 110 and the charge blocking layer 130, a concentration of oxygen atoms in the second charge trapping layer 124 may be lower than a concentration of oxygen atoms in the charge tunneling layer 110.

A chemical composition of the first charge trapping layer 122 may be SiNx (here, x is a positive number) and a chemical composition of the second charge trapping layer 124 may be $SiO_xN_{1-x}$ (here, x is a positive number). The first charge trapping layer 122 may be a nitrogen rich silicon nitride layer having nitrogen atomic percent of more than about 57%. Here, the nitrogen atomic percent represents a ratio of nitrogen to the whole atoms constituting the first charge trapping layer 122. Oxygen atomic percent in the second charge trapping layer 124 may be about 3%~40%. Here, the oxygen atomic percent represents a ratio of oxygen to the whole atoms constituting the second charge trapping layer 124.

The high density trapping layer 120b may be interposed between the deep trapping layer 120a and the charge blocking layer 130 and may be thicker than the first charge trapping layer 122. An energy band gap of the high density trapping layer 120b may be substantially equal to or greater than an energy band gap of the first charge trapping layer 122. An energy band gap of the high density trapping layer 120b may be smaller than an energy band gap of the second charge trapping layer 124. The high density trapping layer 120b may be a single layer formed of (e.g., may consist of) silicon nitride.

The high density trapping layer 120b may be constituted by oxygen atoms and nitrogen atoms, similar to the first charge trapping layer 122. Nitrogen atomic concentration in the high density trapping layer 120b may be lower than nitrogen atomic concentration in the first charge trapping layer 122. Accordingly, an energy band gap of the high density trapping layer 120b may be less than an energy band gap of the first charge trapping layer 122. A density of trap sites in the high density trapping layer 120b may be greater than a density of trap sites in the deep trapping layer 120a. For example, a density of trap sites in the high density trapping layer 120b may be more than about $1 \times 10^{12}/cm^3$. A trap energy level $E_{t2}$ that charges are trapped in the high density trapping layer 120b may be located at an energy level of shallow depth from a conduction band $E_{c2}$ as compared with a trap energy level $E_{t1}$ of the deep trapping layer 120a. A chemical composition of the high density trapping layer 120b may be SiNx or $Si_3N_4$. The high density trapping layer 120b may be a silicon rich silicon nitride layer having nitrogen atomic percent of about 57% or less. According to other embodiments, another insulating layer having an energy band gap greater or smaller than the high density trapping layer 120b may be interposed between the high density trapping layer 120b and the charge blocking layer 130b. Also, the high density trapping layer 120b may be disposed between the first and second charge trapping layers 122 and 124 in the deep trapping layer 120a constituted by the first and second charge trapping layers 122 and 124.

In the present embodiments, the deep trapping layer 120a and the high density trapping layer 120b may be formed by means of a chemical vapor deposition (CVD) process and/or an atomic layer deposition (ALD) process. More specifically, the first charge trapping layer 122 and the high density trapping layer 120b may be deposited using a silicon source gas and a nitrogen source gas and the second charge trapping layer 124 may be deposited using a silicon source gas, a nitrogen source gas and an oxygen source gas. Here, one of hexachlorodisilane (HCD; $Si_2Cl_6$), tetrachlorosilane (TCS; $SiCl_4$) and dichlorosilane (DCS; $SiH_2Cl_2$) may be used as a silicon source gas and one of $H_3$ and $N_2$ may be used as a nitrogen source gas. Also, one of $O_2$, $N_2O$, NO and $O_3$ may be used as an oxygen source gas.

A process of forming the charge trapping layer 120 may be successively performed in a sealed chamber. For example, in the case of forming the charge trapping layer 120 using an atomic layer deposition (ALD) process, the first and second charge trapping layers 122 and 124 and the high density trapping layer 120b can be successively formed by controlling a supply time of an oxygen source gas while supplying a silicon source gas, a nitrogen source gas and an oxygen source gas into a chamber. That is, an oxygen source gas may be selectively supplied only during a formation of the second charge trapping layer 124.

The first charge trapping layer 122 of the deep trapping layer 120a and the charge trapping layer 120b are constituted by (e.g., may consist of) silicon atoms and nitrogen atoms but their nitrogen atomic percent are different from each other. As described above, the first charge trapping layer 122 may be a nitrogen rich silicon nitride and the charge trapping layer 120b may be a silicon rich silicon nitride. To achieve this, TCS may be used as a silicon source gas while forming the first charge trapping layer 122 and HCD may be used as a silicon source gas while forming the high density trapping layer 120b.

The charge trapping layer 120 formed by the process described above may have a structure in which a silicon nitride layer and a silicon oxynitride layer are alternately stacked. An energy band gap and a trap energy level of the first and second charge trapping layers 122 and 124 and the high density trapping layer 120b including nitrogen atoms may become different according to nitrogen atomic concentration. When nitrogen atomic concentration is high, an energy band gap may be reduced and charges may be trapped in a deep energy level from a conduction band of a silicon nitride layer because of a reduction of a trap energy level. Also, when nitrogen atomic concentration is high, a trap site density in a silicon nitride layer may be reduced.

According to some of the present embodiments, nitrogen atomic concentration is lower in a silicon nitride layer adjacent to the charge blocking layer 130 than in a silicon nitride layer adjacent to the charge tunneling layer 110. Thus, in the silicon nitride layer adjacent to the charge tunneling layer 110, charges can be trapped in deep energy level from a conduction band and the silicon nitride layer adjacent to the charge blocking layer 130 may have much more trap sites.

Figure 11:
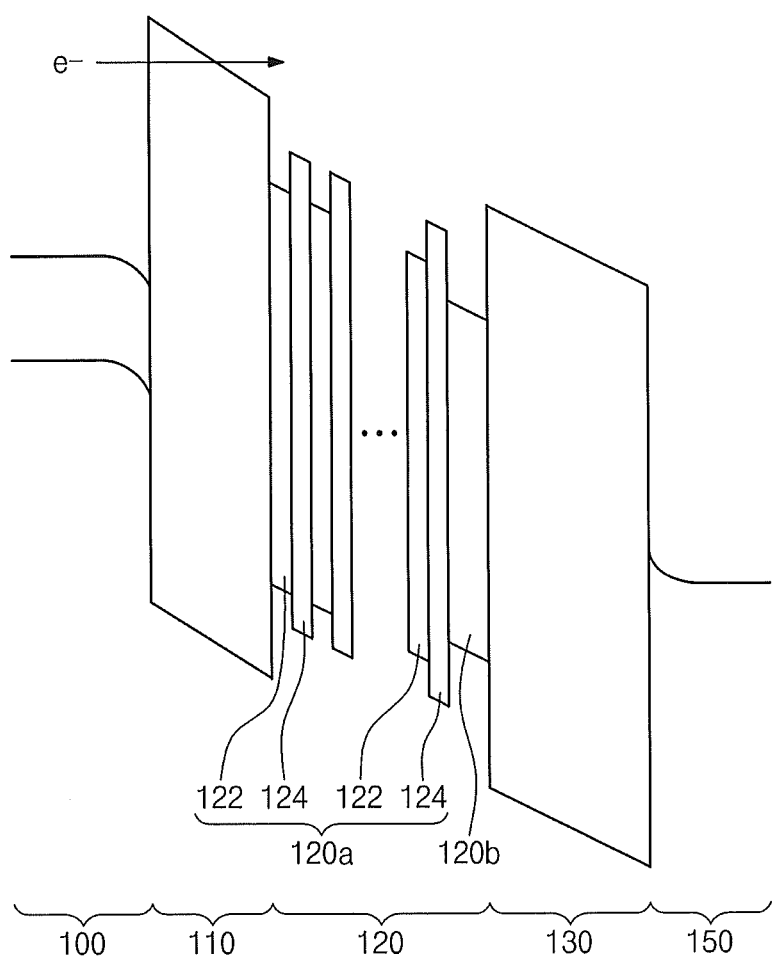
FIG. 11 is an energy band diagram during a program operation in a nonvolatile memory device in accordance with other embodiments of the inventive concept.

FIG. 11 is an energy band diagram during a program operation in a nonvolatile memory device in accordance with other embodiments of the inventive concept.

Referring to FIG. 11, as a high voltage for performing a program operation is applied to the gate electrode 150, energy bands of the charge tunneling layer 110, the charge trapping layer 120 and the charge blocking layer 130 may be bent by a potential difference between the gate electrode 150 and the semiconductor substrate 100. Accordingly, charges in the semiconductor substrate 100 may be F-N (Fowler-Nordheim)-tunneled through an oblique conduction band of the charge tunneling layer 110 to be trapped in trap sites of the charge trapping layer 120.

Charges tunneled to the charge trapping layer 120 may be trapped in the deep trapping layer 120a and the high density trapping layer 120b according to charge energies. At this time, since the deep trapping layer 120a is constituted by the first and second charge trapping layers 122 and 124 having different band gaps from each other, charges penetrating the charge tunneling layer 110 penetrate energy bands having an energy barrier periodically appeared. That is, charges may be trapped in a deep trap energy level of the deep trapping layers 120a while passing through a non-linear conduction band. As charges pass through a non-linear energy band, the probability that charges move in a direction of the gate electrode 150 is gradually reduced. That is, since mobility of charges in the charge trapping layer 120 becomes small, the probability that charges are trapped in charge trapping layer 120 may become high.

Since the deep trapping layers 120a have a trap energy level at a deep location from a conduction band, a density of trap site in which charges are trapped may be low while loss of trapped charges due to excitement of charges is reduced. When a density of trap site in the charge trapping layer 120 is low, speed of a data program and an erasure may be low and a retention time preserving stored data may be reduced. Also, when a multi-level cell storing a plurality of information is embodied in one memory cell to improve a storage capacity of a memory device, much more trap sites may be required to store much more information. As described with reference to FIG. 9, the trapping layer 120 in accordance with embodiments of the inventive concept may include the high density trapping layer 120b having a high trap site density.

Also, the high density trapping layer 120b is disposed between the second charge trapping layer 124 and the charge blocking layer 130. Thus, the high density trapping layer 120b having a smaller energy band gap than the second charge trapping layer 124 is adjacent to the charge blocking layer 130, a height of an energy barrier between the charge trapping layer 120 and the charge blocking layer 130 may increase. Therefore, charges trapped in the charge trapping layer 120 flow into the charge blocking layer 130 may be reduced.

Figure 12:
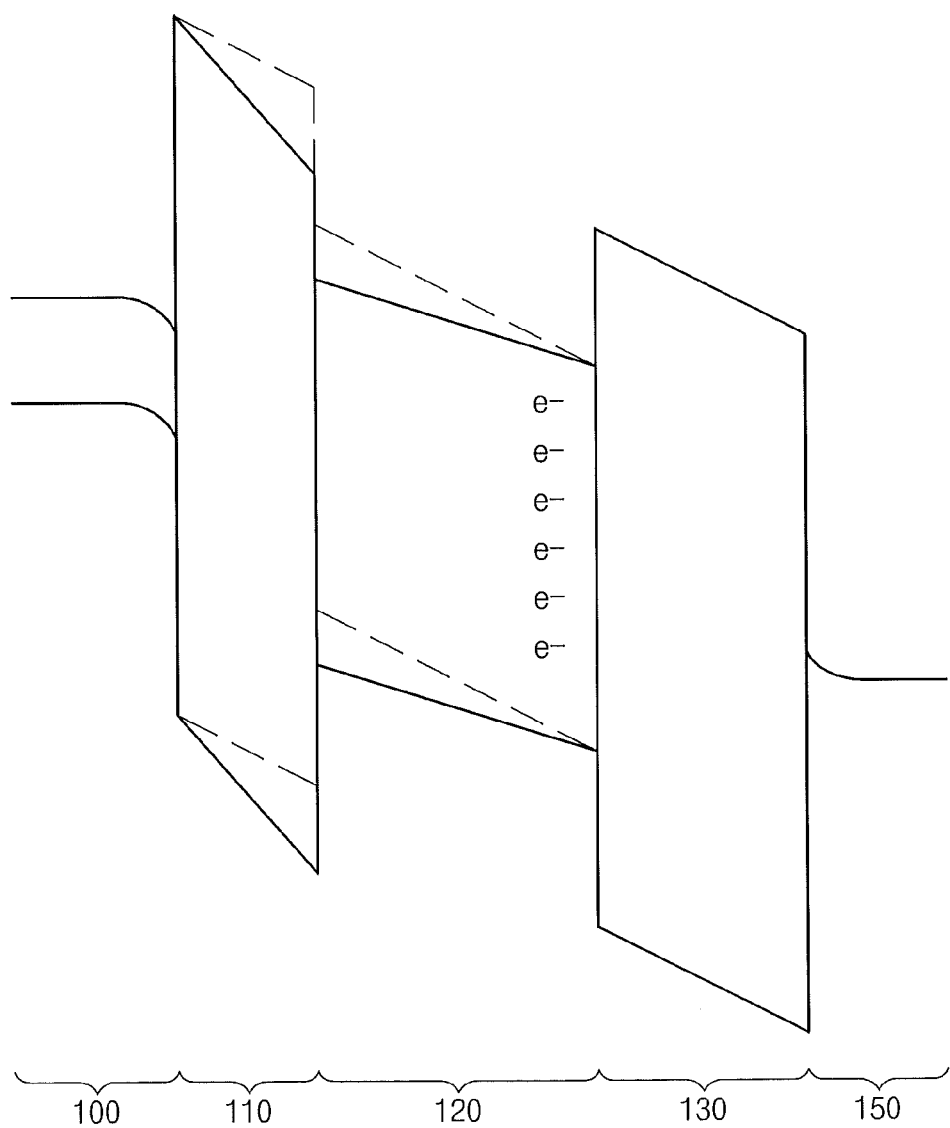
FIG. 12 is a drawing for comparing an energy band during a program operation of nonvolatile memory devices in accordance with embodiments of the inventive concept.

FIG. 12 is a drawing for comparing an energy band during a program operation of nonvolatile memory devices in accordance with embodiments of the inventive concept. In FIG. 12, a dotted line represents a band diagram of a nonvolatile memory device having the charge trapping layer illustrated in FIG. 4 and a solid line represents a band diagram of a nonvolatile memory device having the charge trapping layer illustrated in FIG. 9.

If charges are trapped in the charge trapping layer 120, an electric field applied to the charge tunneling layer 110 may be gradually reduced by charges trapped in the charge trapping layer 120. In embodiments of FIG. 4, since charges penetrating the charge tunneling layer 110 are more easily trapped in a position adjacent to the charge tunneling layer 110, a density of charges trapped in a position adjacent to the charge tunneling layer 110 may be high. That is, the effect of charges trapped in the charge trapping layer 120 on the charge tunneling layer 110 may increase. Thus, a slope of a conduction band and a valence band in the charge tunneling layer 110 may decrease. A thickness of an energy barrier through which charges generated in the semiconductor substrate 100 pass increases and thereby the amount of charges passing through the charge tunneling layer 110 may be reduced. Thus, a program efficiency of a nonvolatile memory device may be deteriorated.

As to embodiments in FIG. 9, if the high density trapping layer 120b is spaced apart from the charge tunneling layer 110 and is disposed to be adjacent to the charge blocking layer 130, a density of charges trapped in a position spaced apart from the charge tunneling layer 110 may be high because a charge trap density in the high density trapping layer 120b is high. That is, the effect of charges trapped in the charge trapped layer 120 on the charge tunneling layer 110 may be reduced. As illustrated in FIG. 12, when a program operation of a nonvolatile memory device is performed, a slope of a conduction band of the charge tunneling layer 110 in the case that the high density trapping layer 120b exists may be greater than a slope of a conduction band of the charge tunneling layer 110 in the case that the high density trapping layer 120b does not exist. Therefore, in the case that that the high density trapping layer 120b exists, the amount of charges passing through the charge tunneling layer 110 increases and thereby an efficiency of a nonvolatile memory device can be improved.

According to other embodiments of the inventive concept, since the charge trapping layer 120 includes the deep trapping layer 120a, charges are trapped in a deep energy level from a conduction band and thereby it can be reduced that charges are thermally excited to be lost. Charge trapping layers can have non-linear conduction band by alternately stacking charge trapping layers having different energy band gaps from each other, thereby reducing or suppressing a vertical diffusion of charges. Also, the charge trapping layer 120 includes a silicon oxynitride layer and thereby a lateral diffusion of the trapped charges can be reduced or suppressed. Thus, a charge retention characteristic of a nonvolatile memory device can be improved.

Also, since the charge trapping layer 120 includes the high density trapping layer 120b having a high trap site density, as illustrated in FIG. 4, a trap site density in the charge trapping layer 120 may be higher than that in a charge trapping layer constituted by only the deep trapping layer 120a having a deep trap energy level. An increase of trap site density in the charge trapping layer 120 may increase a threshold voltage window when a program/erase of a nonvolatile memory device is performed. Thus, an increase of a threshold voltage window may be advantageous to embody a multi-level cell that can store a plurality of information in one memory cell. That is, a storage capacity of a nonvolatile memory device can be increased.

Figure 13:
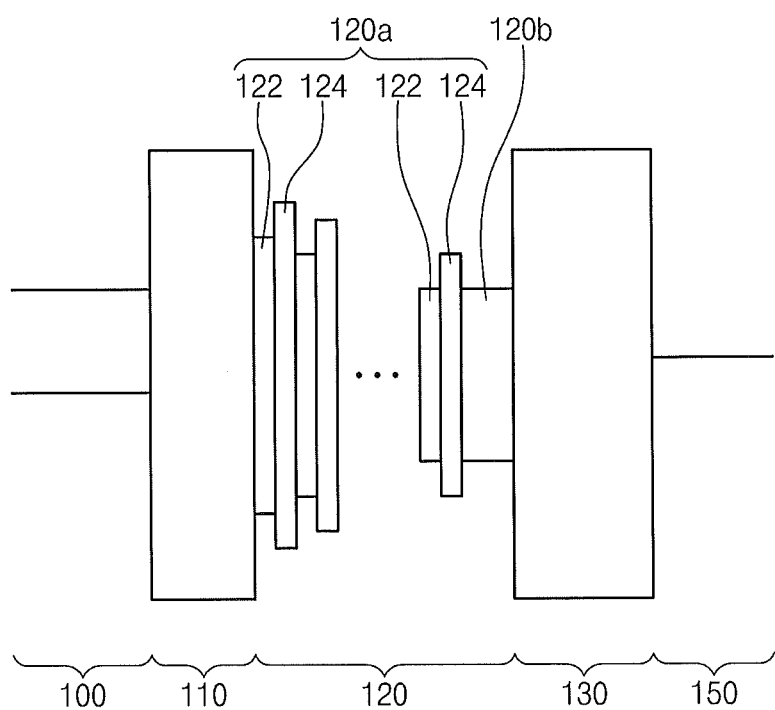
FIGS. 13 and 14 are energy band diagrams of a nonvolatile memory device in accordance with other embodiments of the inventive concept.

FIG. 13 is an energy band diagram of a nonvolatile memory device in accordance with other embodiments of the inventive concept.

Referring to FIG. 13, the charge trapping layer 120 comprises the first and second charge trapping layers 122 and 124 that are alternately stacked and the first and second charge trapping layers 122 and 124 may have different energy band gaps from each other. That is, the charge trapping layer 120 may have an energy band that energy levels of a conduction band are non-linear and energy levels of a valence band are non-linear.

According to these embodiments, energy band gaps of the first charge trapping layers 122 may be gradually reduced when going from the charge trapping layer 110 to the charge blocking layer 130. Energy band gaps of the second charge trapping layers 124 may also be gradually reduced when going from the charge trapping layer 110 to the charge blocking layer 130. A height of barriers formed between the first and second charge trapping layers 122 and 124 adjacent to each other may be uniform. A difference of an energy band gap may become different according to nitrogen content in the charge trapping layer 120. For example, nitrogen content in the first charge trapping layers 122 adjacent to the charge blocking layer 130 may be higher than nitrogen content in the first charge trapping layers 122 adjacent to the charge tunneling layer 110. Oxygen content in the first charge trapping layers 122 adjacent to the charge blocking layer 130 may be lower than oxygen content in the first charge trapping layers 122 adjacent to the charge tunneling layer 110.

The first and second charge trapping layers 122 and 124 that are alternately stacked, as described with reference to FIG. 9, may constitute the deep trapping layer 120a and the high density trapping layer 120b may be interposed between the deep trapping layer 120a and the charge blocking layer 130.

Figure 14:
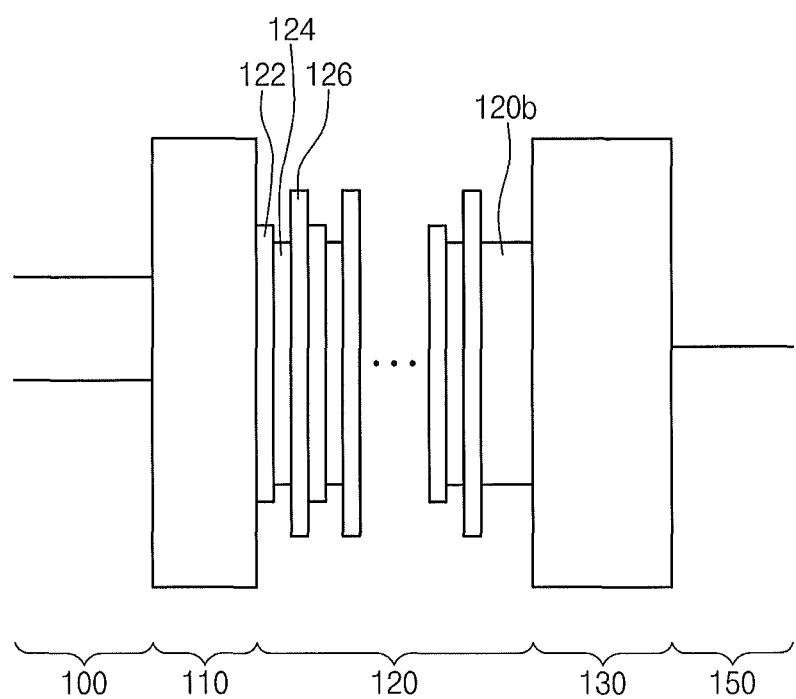

FIG. 14 is an energy band diagram of a nonvolatile memory device in accordance with still other embodiments of the inventive concept.

Referring to FIG. 14, the charge trapping layer 120 may comprise first to third charge trapping layers 122, 124 and 126 that are repeatedly stacked. Here, an energy band gap of the second charge trapping layer 124 may be smaller than an energy band gap of the first charge trapping layer 122. An energy band gap of the third charge trapping layer 126 may be greater than an energy band gap of the first charge trapping layer 122. That is, energy barriers having different heights are formed between the charge tunneling layer 110 and the charge blocking layer 130 and the energy barriers having different heights may periodically appear between the charge tunneling layer 110 and the charge blocking layer 130.

The first to third charge trapping layers 122, 124 and 126 may include silicon atoms. The third charge trapping layer 126 may have the lowest nitrogen atomic percent and the second charge trapping layer 124 may have the highest nitrogen atomic percent. Also, the third charge trapping layer 126 may further comprise oxygen atoms.

The first to third charge trapping layers 122, 124 and 126 that are sequentially and repeatedly stacked, as described with reference to FIG. 9, may constitute the deep trapping layer 120a and the high density trapping layer 120b may be interposed between the deep trapping layer 120a and the charge blocking layer 130.

Figure 15:
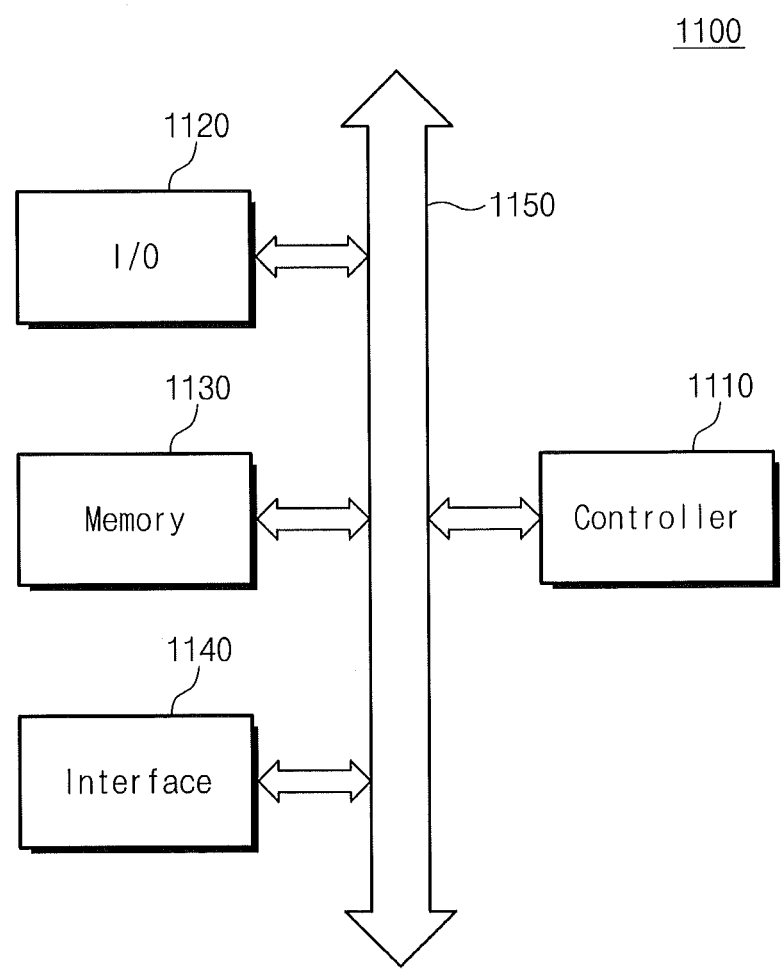
FIG. 15 is a schematic view of a memory system including a nonvolatile memory device in accordance with embodiments of the inventive concept.

FIG. 15 is a schematic view of a memory system including a nonvolatile memory device in accordance with embodiments of the inventive concept.

Referring to FIG. 15, a memory system 1100 can be applied to a PDA (personal digital assistant), a portable computer, a web tablet, a wireless phone, a mobile phone, a digital music player, a memory card and/or all the devices that can transmit and/or receive data in a wireless communication environment.

The memory system 1100 includes a controller 1110, an input/output device 1120 such as a keypad and a displayer, a memory 1130, an interface 1140 and a bus 1150. The memory 1130 and the interface 1140 communicate with each other through the bus 1150.

The controller 1110 includes at least one microprocessor, at least one digital signal processor, at least one micro controller or other process devices similar to the microprocessor, the digital signal processor and the micro controller. The memory 1130 may be used to store an instruction executed by the controller 1110. The input/output device 1120 can receive data or a signal from the outside of the system 1100 or transmit data or a signal to the outside of the system 1100. For example, the input/output device 1120 may include a keyboard, a keypad and/or a displayer.

The memory 1130 includes the nonvolatile memory device according to embodiments of the inventive concept. The memory 1130 may further include a different kind of memory, a volatile memory device capable of random access and various kinds of memories.

The interface 1140 transmits data to a communication network or receives data from a communication network.

Figure 16:
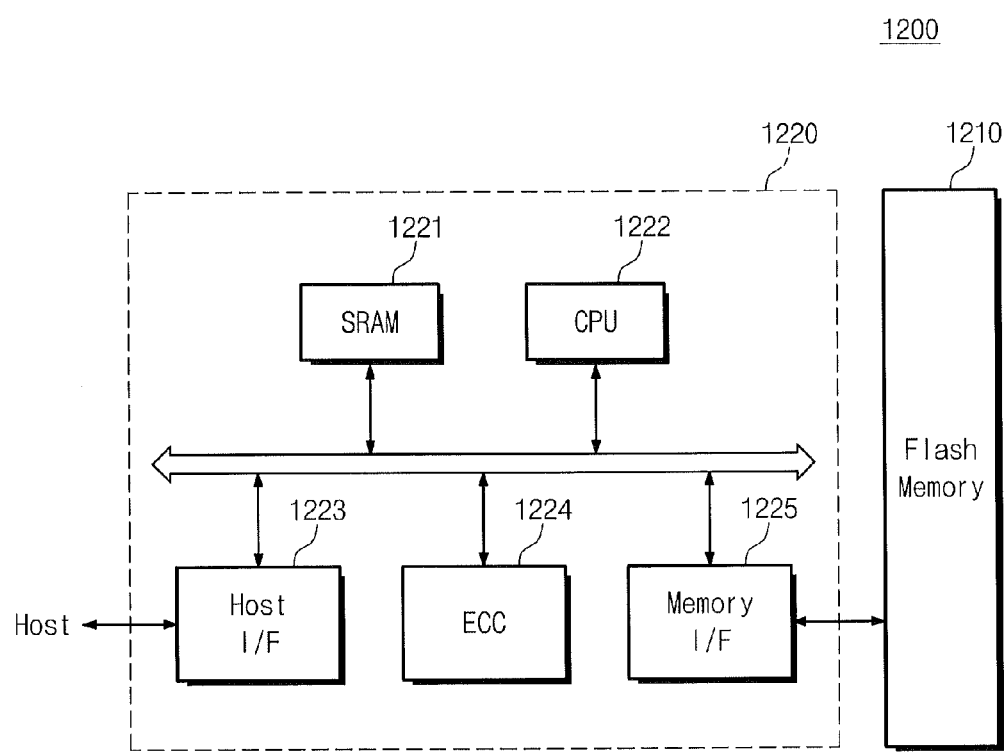
FIG. 16 is a block diagram illustrating an example of a memory card including a flash memory device in accordance with embodiments of the inventive concept.

FIG. 16 is a block diagram illustrating an example of a memory card including a flash memory device in accordance with an embodiment of the inventive concept.

Referring to FIG. 16, the memory card 1200 for supporting a storage capability of a large capacity is fitted with a flash memory device according to an embodiment of the inventive concept. The memory card 1200 according to an embodiment of the inventive concept includes a memory controller 1220 controlling every data exchange between a host and the flash memory device 1210.

A SRAM 1221 is used as an operation memory of a processing unit 1222. A host interface 1223 includes data exchange protocols of a host to be connected to the memory card 1200. An error correction block 1224 detects and corrects errors included in data readout from a multi bit flash memory device 1210. A memory interface 1225 interfaces with the flash memory device 1210 of an embodiment of the inventive concept. The processing unit 1222 performs every control operation for exchanging data of the memory controller 1220. Even though not depicted in drawings, it is apparent to one of ordinary skill in the art that the memory card 1200 according to an embodiment of the inventive concept can further include a ROM (not shown) storing code data for interfacing with the host.

Figure 17:
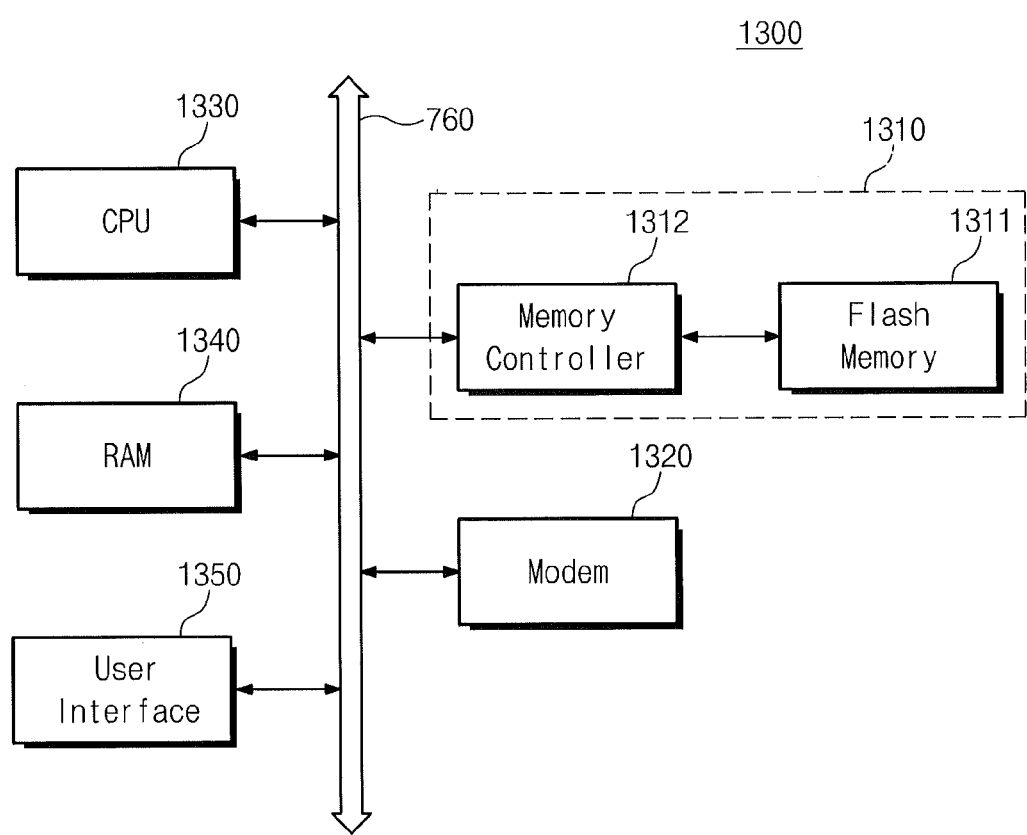
FIG. 17 is a block diagram illustrating a data processing system fitted with a flash memory system in accordance with embodiments of the inventive concept.

FIG. 17 is a block diagram illustrating a data processing system fitted with a flash memory system in accordance with the inventive concept.

Referring to FIG. 17, a flash memory system 1310 of the inventive concept is built in a data processing system such as a mobile product or a desk top computer. The data processing system 1300 according to the inventive concept includes the flash memory system 1310 and a modem 1320, a central processing unit 1330, a RAM (random access memory), a user interface 1350 that are electrically connected to a system bus 1360 respectively. The flash memory system 1310 may be constructed so as to be identical to the memory system or the flash memory system described above. The flash memory system 1310 stores data processed by the central processing unit 1330 or data inputted from an external device. Here, the flash memory system 1310 may be comprised of a SSD (solid state disk) and in this case, the data processing system 1310 can stably store huge amounts of data in the flash memory system 1310. As reliability is improved, the flash memory system 1310 can reduce resources used to correct errors, thereby providing a high speed data exchange function to the data processing system 1300. Even though not depicted in the drawings, it is apparent to one of ordinary skill in the art that the data processing unit 1300 according to an embodiment of the inventive concept can further include an application chipset, a camera image processor (CIS) and/or an input/output device.

Flash memory devices or memory systems according to the inventive concept can be mounted with various types of packages. For example, a flash memory device or a memory system according to the inventive concept can be packaged with methods such as PoP (package on package), ball grid array (BGA), chip scale package (CSP), plastic leaded chip carrier (PLCC), plastic dual in-line package (PDIP), die in waffle pack, die in wafer form, chip on board (COB), ceramic dual in-line package (CERDIP), plastic metric quad flat pack (MQFP), thin quad flat pack (TQFP), small outline (SOIC), shrink small outline package (SSOP), thin small outline (TSOP), thin quad flatpack (TQFP), system in package (SIP), multi chip package (MCP), wafer-level fabricated package (WFP), wafer-level processed stack package (WSP) and mounted.

Nonvolatile memory devices according to an embodiment of the inventive concept can be embodied as a laminate structure in which first and second charge trapping layers having different energy band gaps from each other are repeatedly stacked and can prevent a horizontal movement and a vertical movement of at least some charges by forming a charge trapping layer. Thus, a loss of charges stored in a charge trapping layer can be reduced, thereby improving a charge retention characteristic of a nonvolatile memory device. Consequently, reliability of a nonvolatile memory device can be improved.

Also, since a density of charges trapped in a high density trapping layer adjacent to a charge blocking is higher than a density of charges trapped in a deep trapping layer adjacent to a charge tunneling layer, an electric field applied to the charge tunneling layer when programming data can be prevented from being weakened. Thus, program efficiency of nonvolatile memory devices can be improved.

Although a few embodiments of the present general inventive concept have been shown and described, it will be appreciated by those skilled in the art that changes may be made in these embodiments without departing from the principles and spirit of the general inventive concept, the scope of which is defined in the appended claims and their equivalents. Therefore, the above-disclosed subject matter is to be considered illustrative, and not restrictive.

What is claimed is:

1. A nonvolatile memory device comprising:
    a gate electrode on a substrate;
    a charge trapping layer between the gate electrode and the substrate, the charge trapping layer having trap sites configured to trap charges;
    a charge tunneling layer between the charge trapping layer and the substrate; and
    a charge blocking layer between the gate electrode and the charge trapping layer,
    wherein the charge trapping layer comprises a deep trapping layer having a plurality of energy barriers and a high density trapping layer having a trap site density higher than a trap site density of the deep trapping layer.

2. The nonvolatile memory device of claim 1, wherein the deep trapping layer comprises first trapping layers having a first energy band gap and second trapping layers having a second energy band gap greater than the first energy band gap, the first trapping layers and the second trapping layers being alternately stacked and wherein the energy barriers are formed at interfaces of the first and second trapping layers.

3. The nonvolatile memory device of claim 2, wherein an energy band gap of the high density trapping layer is greater than the first energy band gap and smaller than the second energy band gap.

4. The nonvolatile memory device of claim 2, wherein the first and second energy band gaps are smaller than energy band gaps of the charge tunneling layer and the charge blocking layer.

5. The nonvolatile memory device of claim 2, wherein the trap site density of the high density trapping layer is higher than the trap site density of the first trapping layer.

6. The nonvolatile memory device of claim 2, wherein a thickness of the high density trapping layer is greater than a thickness of the first trapping layer.

7. The nonvolatile memory device of claim 2, wherein each of the first trapping layer and the high density trapping layer comprises silicon atoms and nitrogen atoms and wherein a concentration of the nitrogen atoms in the first trapping layer is higher than a concentration of the nitrogen atoms in the high density trapping layer.

8. The nonvolatile memory device of claim 2, wherein the first trapping layer is a nitrogen rich silicon nitride layer and the high density trapping layer is a silicon rich silicon nitride layer.

9. The nonvolatile memory device of claim 2, wherein the first trapping layer comprises silicon atoms and nitrogen atoms and the second trapping layer comprises silicon atoms, nitrogen atoms and oxygen atoms.

10. The nonvolatile memory device of claim 2, wherein the first trapping layers have different energy levels in a conduction band and different energy levels in a valence band, and the second trapping layers have different energy levels in a conduction band and different energy levels in a valence band.

11. The nonvolatile memory device of claim 1, wherein the high density trapping layer is disposed between the deep trapping layer and the charge blocking layer.

12. The nonvolatile memory device of claim 1, wherein an energy level of the trap sites in the deep trapping layer is lower than an energy level of the trap sites in the high density trapping layer.

13. A nonvolatile memory device comprising:
    a gate electrode on a substrate;
    a charge trapping layer between the gate electrode and the substrate, the charge trapping layer comprising first trapping layers including silicon and nitrogen and second trapping layers including silicon, nitrogen and oxygen that are alternately stacked, wherein the first and second trapping layers have different composition stoichiometries therebetween;
    a charge tunneling layer between the charge trapping layer and the substrate; and
    a charge blocking layer between the gate electrode and the charge trapping layer, wherein nitrogen content in one first trapping layer is greater than nitrogen content in another first trapping layer.

14. The nonvolatile memory device of claim 13, wherein the one first trapping layer having greater nitrogen content is adjacent to the charge tunneling layer.

15. The nonvolatile memory device of claim 13, wherein the first trapping layer adjacent to the charge blocking layer is thicker than the first trapping layer adjacent to the charge tunneling layer.

16. The nonvolatile memory device of claim 13, wherein an energy band gap of the second trapping layers is greater than an energy band gap of the first trapping layers.

17. The nonvolatile memory device of claim 13, wherein the first trapping layer adjacent to the charge blocking layer has an energy band gap less than the first trapping layer adjacent to the charge tunneling layer.

18. The nonvolatile memory device of claim 13, wherein the charge trapping layer comprises trap sites configured to trap charges and an energy level of the trap sites in the first trapping layer adjacent to the charge tunneling layer is lower than an energy level of the trap sites in the first trapping layer adjacent to the charge blocking layer.

19. A nonvolatile memory device comprising:
a substrate;
a gate electrode that is spaced apart from the substrate; and
a charge tunneling layer, a charge blocking layer, a high density charge trapping layer and a deep charge trapping layer, all of which are stacked between the substrate and the gate electrode, the high density charge trapping layer and the deep charge trapping layer having different composition stoichiometries therebetween that are also different than that of both the charge tunneling layer and the charge blocking layer,
wherein the deep charge trapping layer comprises a plurality of alternating first and second charge trapping layers having different composition stoichiometries therebetween.

* * * * *